US009885765B2

(12) United States Patent
Zeng et al.

(10) Patent No.: US 9,885,765 B2
(45) Date of Patent: Feb. 6, 2018

(54) APPARATUS AND METHOD FOR AMPLIFYING A RADIO-FREQUENCY SIGNAL

(71) Applicant: KONINKLIJKE PHILIPS N.V., Eindhoven (NL)

(72) Inventors: Keqiu Zeng, Shanghai (CN); Yong Liu, Shanghai (CN); Tao Wang, Shanghai (CN)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 586 days.

(21) Appl. No.: 14/381,013

(22) PCT Filed: Feb. 20, 2013

(86) PCT No.: PCT/IB2013/051355
§ 371 (c)(1),
(2) Date: Aug. 26, 2014

(87) PCT Pub. No.: WO2013/128335
PCT Pub. Date: Sep. 6, 2013

(65) Prior Publication Data
US 2015/0042340 A1 Feb. 12, 2015

(30) Foreign Application Priority Data
Mar. 2, 2012 (WO) ................ PCT/CN2012/071856

(51) Int. Cl.
*H03F 3/04* (2006.01)
*G01R 33/36* (2006.01)
(Continued)

(52) U.S. Cl.
CPC .......... *G01R 33/3614* (2013.01); *H03F 1/56* (2013.01); *H03F 3/193* (2013.01); *H03F 3/21* (2013.01);
(Continued)

(58) Field of Classification Search
CPC ........................................................ H03F 1/56
(Continued)

(56) References Cited

U.S. PATENT DOCUMENTS 4,613,843 A 9/1986 Esper
5,061,910 A 10/1991 Bouny
(Continued)

FOREIGN PATENT DOCUMENTS

CN 201414113 Y 2/2010
CN 202135098 U 2/2012
(Continued)

OTHER PUBLICATIONS

Hoult, D.I., et al "A 500 W, Broadband, Non-Magnetic RF MOSFET Amplifier for MRI Use", Proceedings of International Society for Magnetic Resonance in Medicine, Apr. 2008, pp. 1139.
(Continued)

*Primary Examiner* — Khanh V Nguyen
*Assistant Examiner* — Khiem Nguyen

(57) ABSTRACT

The present invention provides an apparatus and a method for amplifying a radio-frequency signal and an MRI system comprising the apparatus. An aspect of the present invention proposes an apparatus for amplifying a radio-frequency (RF) signal comprising: a magnetically insensitive input balun (10) for converting the RF signal in unbalanced format into balanced signals; at least two groups of MOSFETs, each group including at least one MOSFET (30, 40), for respectively amplifying the balanced signals in a push-pull way; a magnetically insensitive output balun (60) for converting the amplified balanced signals into an unbalanced format; a magnetically insensitive input matching network (20, 20') for matching input impedances of the at least two groups of MOSFETs with output impedances of the magnetically insensitive input balun (10); a magnetically insensitive out-
(Continued)

put matching network (50, 50') for matching output impedances of the at least two groups of MOSFETs with input impedances of the magnetically insensitive output balun (60); a magnetically insensitive protection circuit (70, 70') for protecting a direct current (DC) power supply which provides DC for driving the at least two groups of MOSFETs from the amplified balanced signals. The proposed apparatus not only has a high power output but is also magnetically insensitive, so that it can operate in an environment of strong magnetic fields, such as the MRI scanner room.

19 Claims, 6 Drawing Sheets

(51) Int. Cl.

| | | |
|---|---|---|
| *H03F 3/193* | (2006.01) | |
| *H03F 3/21* | (2006.01) | |
| *H03F 3/30* | (2006.01) | |
| *H03F 3/191* | (2006.01) | |
| *H03F 1/56* | (2006.01) | |

(52) U.S. Cl.
 CPC ........... *H03F 3/211* (2013.01); *H03F 3/3045* (2013.01); *H03F 1/565* (2013.01); *H03F 3/191* (2013.01); *H03F 2200/06* (2013.01); *H03F 2200/09* (2013.01); *H03F 2200/222* (2013.01); *H03F 2200/255* (2013.01); *H03F 2200/318* (2013.01); *H03F 2200/387* (2013.01); *H03F 2200/423* (2013.01); *H03F 2200/451* (2013.01); *H03F 2203/21106* (2013.01)

(58) Field of Classification Search
 USPC .............................. 330/301, 124 R, 295, 251
 See application file for complete search history.

(56) References Cited

U.S. PATENT DOCUMENTS

| | | | | |
|---|---|---|---|---|
| 5,420,537 | A * | 5/1995 | Weedon | ................. H03F 3/193 330/251 |
| 7,020,452 | B1 * | 3/2006 | Kobayashi | ........... H03D 9/0633 327/113 |
| 7,378,851 | B1 | 5/2008 | De Rooij | |
| 7,768,371 | B2 | 8/2010 | Hui | |
| 7,915,992 | B2 | 3/2011 | De Rooij | |
| 7,973,600 | B2 * | 7/2011 | Yu | ......................... H03F 1/0288 330/124 R |
| 2001/0001548 | A1 | 5/2001 | Ishida | |
| 2005/0083122 | A1 | 4/2005 | Tayrani | |
| 2007/0080750 | A1 * | 4/2007 | Liebenrood | ........... H03F 1/0261 330/252 |
| 2009/0134876 | A1 | 5/2009 | Griswold | |

FOREIGN PATENT DOCUMENTS

| | | |
|---|---|---|
| WO | 2007046014 A2 | 4/2007 |
| WO | 2010076682 A1 | 7/2010 |

OTHER PUBLICATIONS

Yimin, Wang, et al "kW High Power Amplifier using Planar Printed Balun", Design and Development of IC, 2010. English Abstract Only.

* cited by examiner

US 9,885,765 B2

APPARATUS AND METHOD FOR AMPLIFYING A RADIO-FREQUENCY SIGNAL

CROSS-REFERENCE TO PRIOR APPLICATIONS

This application is the U.S. National Phase application under 35 U.S.C. §371 of International Application No. PCT/IB2013/051355, filed on Feb. 20, 2013, which claims the benefit of Chinese Patent Application No. PCT/CN2012/071856, filed on Mar. 2, 2012. These applications are hereby incorporated by reference herein.

FIELD OF THE INVENTION

The present disclosure relates generally to magnetic resonance imaging (MRI) systems, and more specifically to techniques for amplifying a radio-frequency (RF) signal.

BACKGROUND OF THE INVENTION

MRI, as a medical imaging technique, makes use of the property of nuclear magnetic resonance (NMR) to image nuclei of atoms inside the body. In a MRI system, a powerful magnetic field is generated to align the magnetization of some atomic nuclei in the body, and radio frequency fields may be introduced to systematically alter the alignment of this magnetization. This causes the nuclei to produce a rotating magnetic field detectable by a scanner—and this information on the rotating magnetic field is recorded to construct an image of the scanned area of the body.

As shown in FIG. 1, in the MRI system, a main magnet which generates the powerful magnetic field is disposed in a scanner room (i.e., magnet room) 11. Most of—the electronic devices 14 used in the MRI system, including a RF amplifier for generating the radio frequency fields, should be placed in a separate room (i.e., technical room) 12 so as to protect these electronic devices from a strong magnetic environment. The magnet room 11 should be shielded by an RF cage 13 to further prevent these electronic devices 14 being affected by the powerful magnetic field. The RF signal generated by the RF amplifier in the technical room 12, usually, is transmitted to the main magnet through a hole 15 in the wall of the magnet room 11 via a long cable—which may cause huge loss, resulting in the cost of MRI being high.

There is therefore a need in the art for techniques to efficiently provide the RF signal in a MRI system.

SUMMARY OF THE INVENTION

Techniques for efficiently providing the RF signal in a MRI system are described herein. In an aspect, there is provided an apparatus for amplifying a radio-frequency (RF) signal, comprising: a magnetically insensitive input balun (10) for converting the RF signal in unbalanced format into balanced signals; at least two groups of MOSFETs, each group including at least one MOSFET (30, 40), for respectively amplifying the balanced signals in a push-pull way; a magnetically insensitive output balun (60) for converting the amplified balanced signals into an unbalanced format; a magnetically insensitive input matching network (20, 20') for matching input impedances of the at least two groups of MOSFETs with output impedances of the magnetically insensitive input balun (10); a magnetically insensitive output matching network (50, 50') for matching output impedances of the at least two groups of MOSFETs with input impedances of the magnetically insensitive output balun (60); and a magnetically insensitive protection circuit (70, 70') for protecting a direct current (DC) power supply which provides DC for driving the at least two groups of MOSFETs from the amplified balanced signals.

In one design, both the magnetically insensitive input balun (10) and the magnetically insensitive output balun (60) do not use any magnetically sensitive material, e.g. ferrite; both the magnetically insensitive input matching network (20, 20') and the magnetically insensitive output matching network (50, 50') do not use the magnetically sensitive components, such as inductors, ferrite transformers and RF chock coils. So, the apparatus may operate in an environment of strong magnetic fields, e.g. the scanner room, due to the fact that there are no magnetically sensitive components included in the MRI system.

In another aspect, there is provided a magnetic resonance imaging (MRI) system, comprising the apparatus according to the above aspect of the present invention.

In another aspect, there is provided a method of amplifying a radio-frequency (RF) signal, comprising: converting the RF signal in unbalanced format into balanced signals by a magnetically insensitive input balun (10); matching input impedances of at least two groups of MOSFETs with output impedances of the magnetically insensitive input balun (10) by a magnetically insensitive input matching network (20, 20'); amplifying the balanced signals in a push-pull way by the at least two groups of MOSFETs, each group including at least one MOSFET (30, 40); matching output impedances of the at least two groups of MOSFETs with input impedances of a magnetically insensitive output balun (60) by a magnetically insensitive output matching network (50, 50'); converting the amplified balanced signals into an unbalanced format by the magnetically insensitive output balun (60); wherein the amplified balanced signals may be blocked by a magnetically insensitive protection circuit (70, 70') from a direct current (DC) power supply which provides DC for driving the at least two groups of MOSFETs.

Various aspects and features of the disclosure are described in further detail hereinbelow. And other objects and advantages of the present invention will become more apparent and will be easily understood with reference to the description made in combination with the accompanying drawings.

DESCRIPTION OF THE DRAWINGS

The present disclosure will be described and explained hereinafter in more detail in combination with embodiments and with reference to the drawings, wherein.

Figure 1:
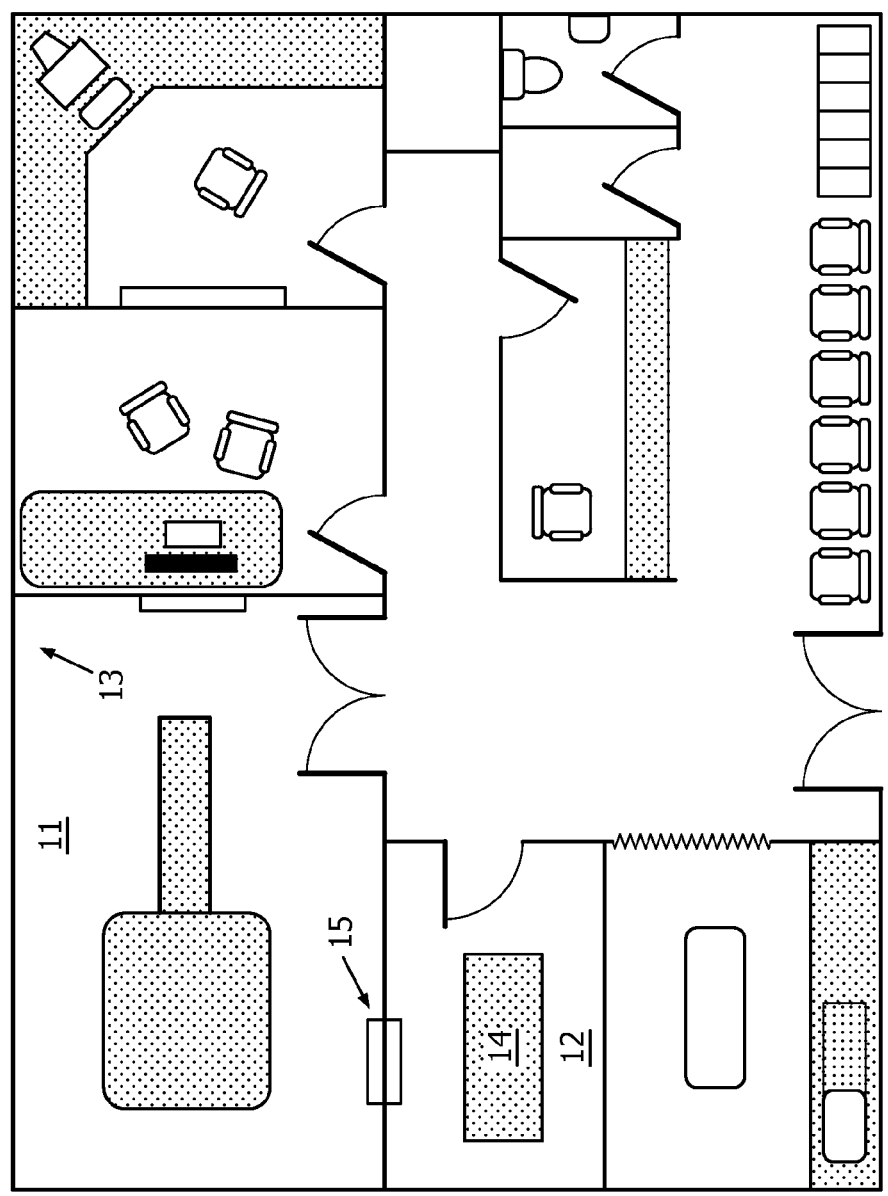
FIG. 1 is a layout of a MRI system in a hospital.

The same reference signs in the figures indicate similar or corresponding features and/or functionalities.

DETAILED DESCRIPTION

The present invention will be described with respect to particular embodiments and with reference to certain drawings but the invention is not limited thereto, but is limited only by the claims. The drawings described are only schematic and are non-limiting. In the drawings, the size of some of the elements may be exaggerated and not drawn on scale for illustrative purposes.

Figure 2:
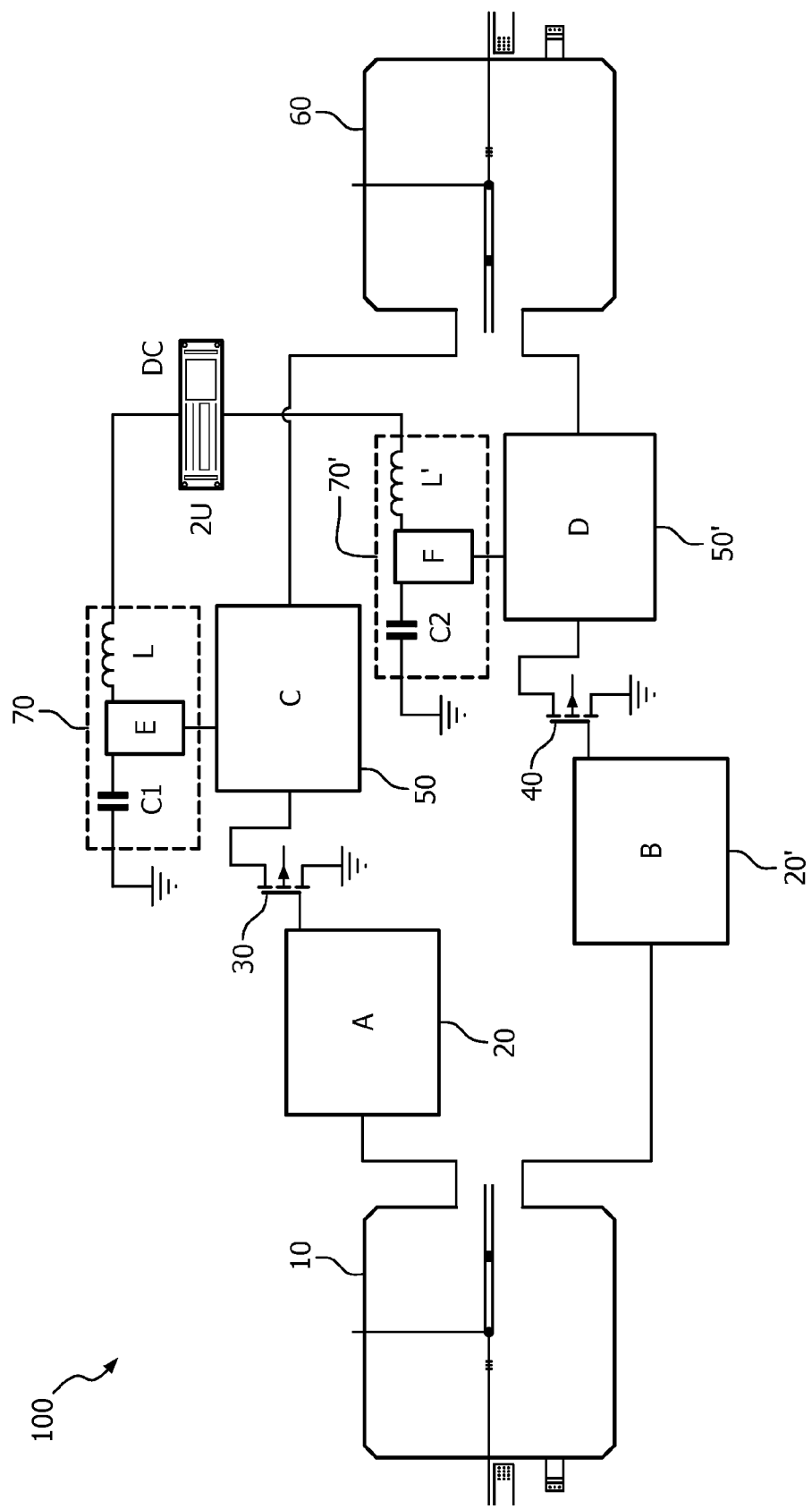
FIG. 2 shows a structure of a RF amplifier.

FIG. 2 shows a structure of the apparatus for amplifying a radio-frequency signal, e.g. a RF amplifier 100. The RF amplifier 100 comprises a magnetically insensitive input balun 10, a magnetically insensitive input matching network, two groups of MOSFETs, a magnetically insensitive output matching network, a magnetically insensitive output balun 60 and a magnetically insensitive protection circuit.

The magnetically insensitive input balun 10 is provided for converting a RF signal in an unbalanced format into balanced signals and the magnetically insensitive output balun 60 is provided for converting the balanced signals into an unbalanced format. Both the magnetically insensitive input balun 10 and the magnetically insensitive output balun 60 do not use any magnetically sensitive material, e.g. ferrite. Instead of the coaxial transmission line transformers, which include magnetically sensitive material, each of the magnetically insensitive input balun 10 and the magnetically insensitive output balun 60 may be a planar magnetically insensitive balun. In one example design, it has a planar structure with an air-cored transmission line formed by Printed Circuit Board (PCB) technology.

In one design, the planar structure comprises two coils formed on the top layer and the bottom layer of the PCB substrate, respectively. The coil on the top layer has two parallel strips as the balanced port, wherein the two parallel strips are disposed symmetrically with respect to the body of the coil and are separated by a slit. There is an aperture in the center of the coil on the top layer and the coil on the top layer is large enough to cover the coil on the bottom layer. The coil of the top layer and the coil of the bottom layer may be operated to resonate at a certain operating frequency.

In another design, instead of the aperture in the center of the coil on the top layer, the body of the coil on the top layer of the planar structure has an extended portion of the slit between the two parallel strips. A more detailed description of this type of planar balun is disclosed, for example, in a patent entitled "A planar balun" filed by Koninklijke Philips Electronics N.V., on Dec. 24, 2010, Chinese Patent Serial No. 201020689207.1, the disclosure of which is hereby incorporated by reference. The balun with such planar structure may operate efficiently due to the insertion loss/return loss benefit and may be more suitable to operate in the environment of a stronger magnetic field.

As shown in FIG. 2, each of the two groups of MOSFETs includes one MOSFET, i.e., MOSFET 30 and MOSFET 40. The magnetically insensitive input matching network, in one design, includes two input matching circuits 20 and 20' corresponding to MOSFET 30 and MOSFET 40 respectively. The two input matching circuits 20 and 20' may have similar or different structures. In one design, the input matching circuit 20 comprises a microstrip line A and the input matching circuit 20' comprises a microstrip line B. The microstrip lines A and B may be formed by PCB technology. Both the size of the microstrip line A and the size of the microstrip line B may be scaled to enable the input impedances of the two MOSFETs 30 and 40 to be matched with the output impedances of the magnetically insensitive input balun 10.

Alternatively, in another design, the magnetically insensitive input matching network may include one input matching circuit, e.g. a packaged circuit including a group of microstrip lines, for matching the input impedances of the two groups of MOSFETs with the output impedances of the magnetically insensitive input balun 10.

Similarly, the magnetically insensitive output matching network may include two output matching circuits 50 and 50' corresponding to MOSFET 30 and MOSFET 40, respectively. The output matching circuit 50 comprises a microstrip line C and the output matching circuit 50' comprises a microstrip line D. The microstrip lines C and D may also be formed by PCB technology. Either the size of the microstrip line C or the size of the microstrip line D may be scaled to enable the output impedances of the two MOSFETs 30 and 40 to be matched with the input impedances of the magnetically insensitive output balun 60.

Alternatively, in another design, the magnetically insensitive output matching network may include one output matching circuit, e.g. a packaged circuit including a group of microstrip lines, for matching the output impedances of the two groups of MOSFETs with the input impedances of the magnetically insensitive output balun 60.

As shown in FIG. 2, both the magnetically insensitive input matching network and the magnetically insensitive output matching network do not use magnetically sensitive components, such as inductors, ferrite transformers and RF chock coils. So, there are linear matching networks in the RF amplifier 100. The loss in the linear matching networks may be low and the performance of the RF amplifier 100 may be improved.

The magnetically insensitive protection circuit is provided for protecting a direct current (DC) power supply from the balanced signals output by the two groups of MOSFETs. The DC power supply serves for driving the MOSFETs in the two groups of MOSFETs. In one design, the magnetically insensitive protection circuit may include two sub-circuits 70 and 70' corresponding to the two groups of MOSFETs respectively, i.e., MOSFET 30 and MOSFET 40. The two sub-circuits 70 and 70' may have similar or different structures.

In one design, the sub-circuit 70 may include strip line E and capacitor C1, and the sub-circuit 70' may include strip line F and capacitor C2. The strip line E (e.g. dimension), the capacitor C1 (e.g. capacitance) and the microstrip line C (e.g. dimension) may be scaled to form a RF ground, so the balanced signals output by the MOSFET 30 are not fed to the DC power supply. The strip line F (e.g. dimension), the capacitor C2 (e.g. capacitance) and the microstrip line D (e.g. dimension) may be scaled to form a RF ground, so the balanced signals output by the MOSFET 40 are not fed to the DC power supply.

Alternatively, in another design, the magnetically insensitive protection circuit may include one protection circuit, e.g. a packaged circuit including two groups of strip lines and two groups of capacitors corresponding to the two groups of MOSFETs respectively. The strip line, the capacitor and the microstrip line corresponding to the same group of MOSFETs may be scaled to form a RF ground to enable the balanced signals output by the corresponding group of MOSFETs to be fed to the RF ground, so the DC power supply may be protected from the balanced signals accordingly.

In another design, any one of the sub-circuits 70 and 70' may further include a cable for improving the RF blocking performance. For example, the cable L, placed between the DC power supply and the capacitor C1, may be operated with the strip line E, the capacitor C1 and the microstrip line C for blocking the balanced signals output by the MOSFET 30 from the DC power supply. In one design, the cable may be a certain length of twisted-pair cable.

Compared with the prior art, where the RF energy in the balanced signals is blocked by an RF chock (or a ferrite chock) as an open circuit, the magnetically insensitive protection circuit does not use any magnetically sensitive material. That is to say, there is provided a compact RF-grounding technique associated with the magnetically insensitive protection circuit as described in the above designs. The RF-grounding technique and the distributed inductive power line in the RF amplifier 100 play the same role as the RF chock in the prior art. As the large magnetically sensitive RF chock is no longer used, the volume of the RF amplifier 100 is small and a compact MRI system may be realized.

Figure 3:
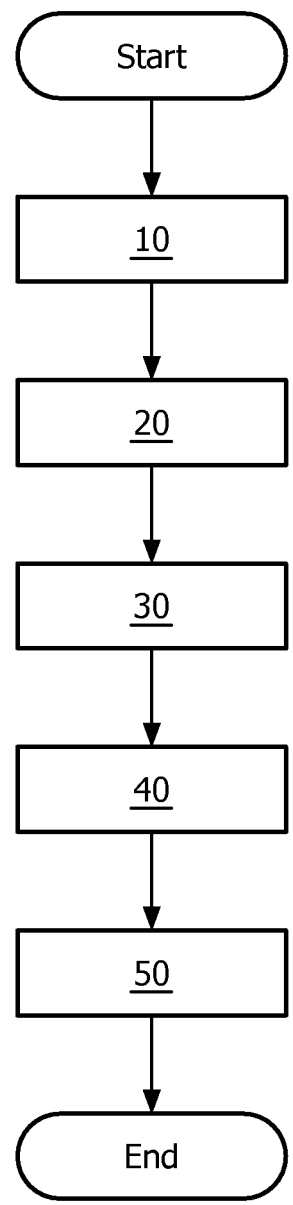
FIG. 3 is a flowchart of the method of amplifying a radio-frequency signal.

FIG. 3 shows a flowchart of the method, performed by an RF amplifier, e.g. the RF amplifier 100 shown in FIG. 2, for amplifying a radio-frequency (RF) signal.

An RF signal is applied to the unbalanced port of the magnetically insensitive input balun 10. The magnetically insensitive input balun 10 converts the RF signal (i.e. single-ended) into balanced signals (i.e. differential signals) (Block 10). The balanced signals are supplied to the magnetically insensitive input matching network. In one design, the input matching circuits 20 and 20' are provided in the magnetically insensitive input matching network for matching the input impedances of the two groups of MOSFETs with the output impedances of the magnetically insensitive input balun 10 respectively (Block 20). In one design, each group of MOSFETs includes one MOSFET, e.g. MOSFETs 30 and 40 as shown in FIG. 2. The MOSFETs 30 and 40 may amplify the balanced signals in a push-pull way (Block 30). As the balanced signals are differential signals, the MOSFETs 30 and 40 may select the same type of MOSFET.

The amplified balanced signals output by the MOSFETs 30 and 40 are supplied to the magnetically insensitive output matching network. In one design, the output matching circuits 50 and 50' are provided in the magnetically insensitive output matching network for matching the output impedances of the MOSFETs 30 and 40 with the input impedances of the magnetically insensitive output balun 60 respectively (Block 40). The magnetically insensitive output balun 60 converts the amplified balanced signals into an unbalanced format (Block 50).

Besides being supplied to the magnetically insensitive output matching network, the amplified balanced signals output by the MOSFETs 30 and 40 may be blocked by the magnetically insensitive protection circuit (e.g. sub-circuits 70 and 70' shown in FIG. 2) from the DC power supply (not shown in FIG. 3).

Figure 4:
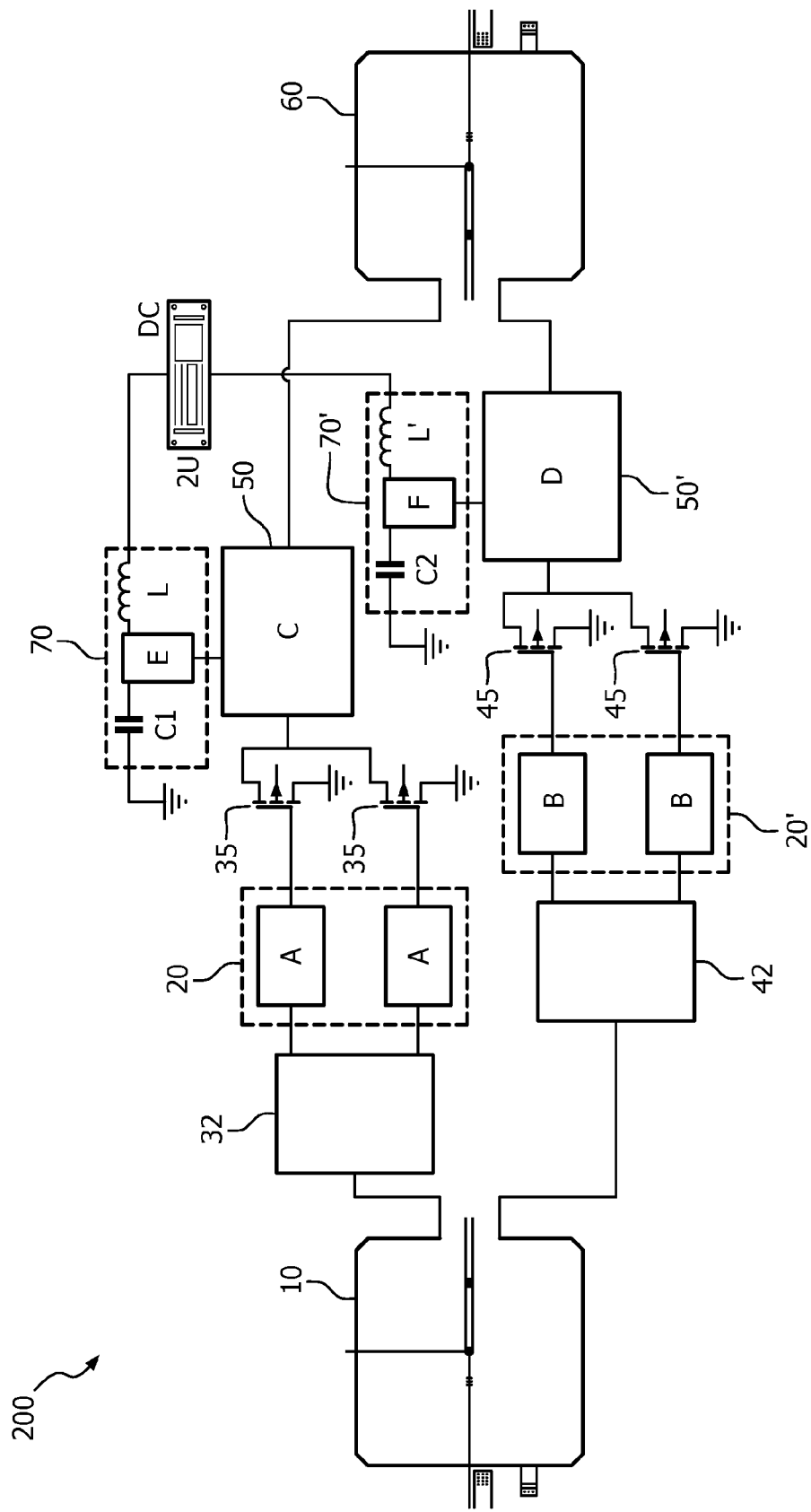
FIG. 4 shows another structure of a RF amplifier.

FIG. 4 shows another structure of the apparatus for amplifying a RF signal, e.g. a RF amplifier 200. In this design, each of the two groups of MOSFETs includes two MOSFETs. Particularly, the first group of MOSFETs may include two MOSFETs 35 and the second group of MOSFETs may include two MOSFETs 45. Correspondingly, the input matching circuit 20 comprises two microstrip lines A and the input matching circuit 20' comprises two microstrip lines B. The RF amplifier 200 further comprises two splitters 32, 42. In the example design, each of the splitters 32 and 42 may be a power splitter. The balanced signals output by the magnetically insensitive input balun 10 are divided by the splitters 32, 42 and supplied to the input matching circuit 20 and the input matching circuit 20' respectively. In this design, the balanced signals divided by the splitter 32 may be matched with the corresponding input impedances of the two MOSFETs 35 by the two microstrip lines A and the balanced signals divided by the splitter 42 may be matched with the corresponding input impedances of the two MOSFETs 45 by the two microstrip lines B.

In another design, each of the two groups of MOSFETs may include more than two MOSFETs. Each of the two splitters 32 and 42 should divide the balanced signals output by the magnetically insensitive input balun 10 in accordance with the number of MOSFETs in each group of MOSFETs so as to distribute the divided balanced signals to each MOSFET in the two groups of MOSFETs. The input matching circuit 20 should comprise a group of microstrip lines A and the input matching circuit 20' should comprise a group of microstrip lines B corresponding to the number of MOSFETs in each of the two groups of MOSFETs. Each of the microstrip lines A and B is provided for enabling each of the divided balanced signals to be matched with the input impedance of the corresponding MOSFET in the two groups of MOSFETs.

The method performed by the RF amplifier 200 shown in FIG. 4 is similar to the method performed by the RF amplifier 100 in FIG. 2. The method of the RF amplifier 200 further comprises a step of dividing the balanced signals by the two splitters 32, 42 and a step of supplying the divided balanced signals to the input matching circuits 20 and 20' for enabling each of the divided balanced signals to be matched with the input impedance of the corresponding MOSFET in the two groups of MOSFETs.

Figure 5:
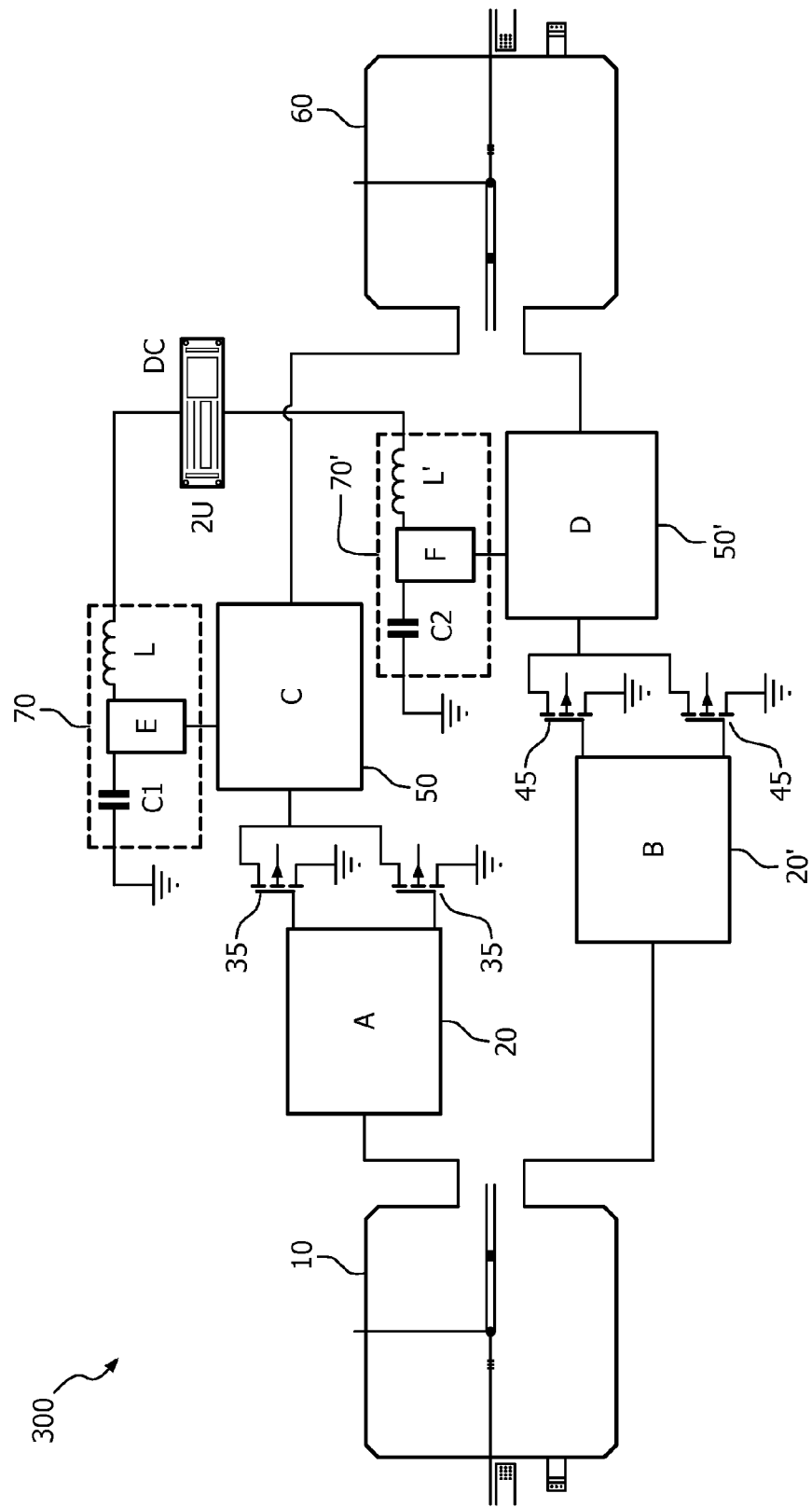
FIG. 5 shows another structure of a RF amplifier.
Figure 6:
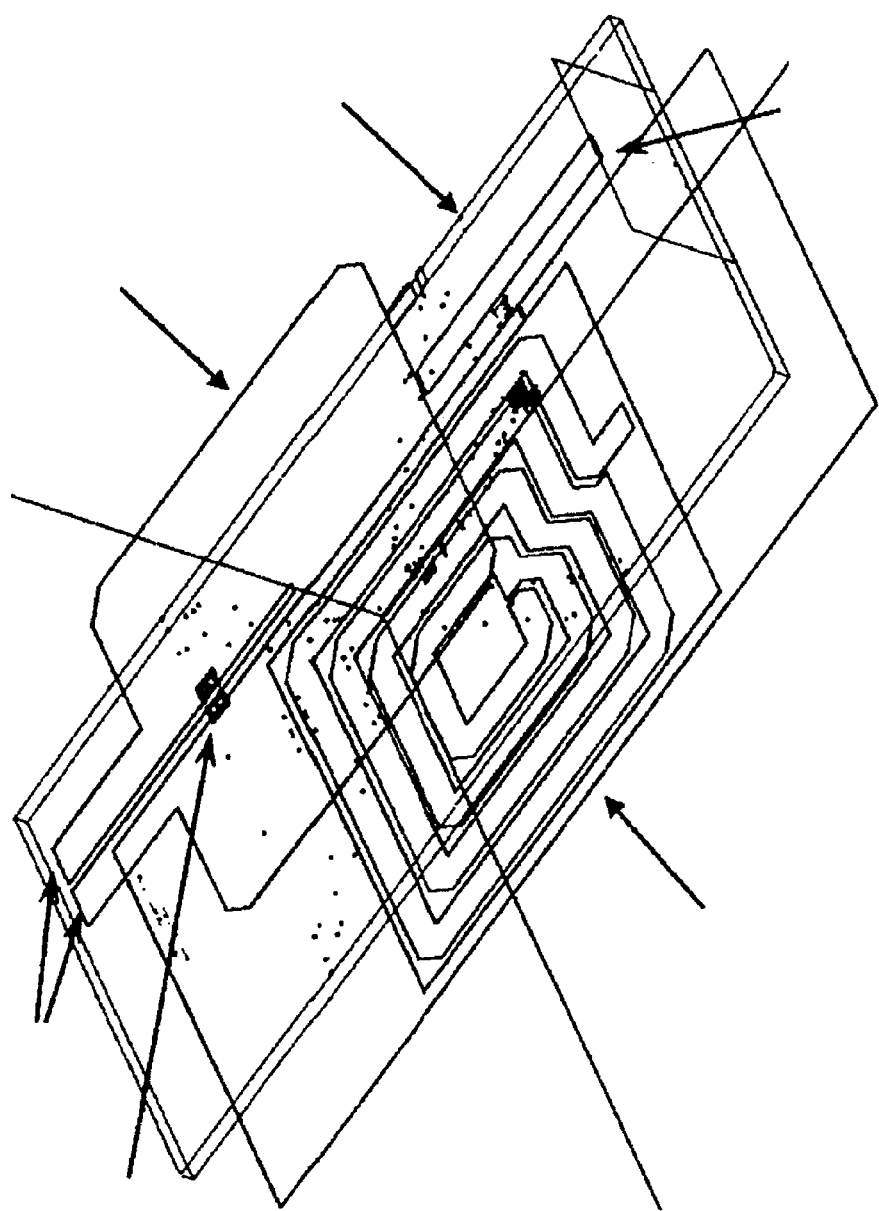
FIG. 6 is a 3D view of a planar balun according to another aspect.

FIG. 5 shows another structure of the apparatus for amplifying a RF signal, e.g. a RF amplifier 300. In this design, each of the two groups of MOSFETs includes two MOSFETs. Particularly, the first group of MOSFETs may include two MOSFETs 35, wherein the gate electrodes, the drain electrodes of the two MOSFETs 35 are parallel-connected and the second group of MOSFETs may include two MOSFETs 45, wherein the gate electrodes, the drain electrodes of the two MOSFETs 45 are also parallel-connected. Accordingly, the input matching circuit 20 may comprise one microstrip line A and the input matching circuit 20' may comprise one microstrip line B for enabling the input impedances of the two groups of MOSFETs to be matched with the output impedances of the magnetically insensitive input balun 10 respectively.

By taking advantage of the parallel-gate structure shown in FIG. 5, i.e. the gate electrodes, the drain electrodes of the two MOSFETs 35 and 45 are parallel-connected respectively, a potential signal unbalance introduced by a 90° hybrid or power splitter may be removed and the debugging of the magnetically insensitive input matching network thus becomes easy. Moreover, with the parallel-gate structure shown in FIG. 5, the width of the microstrip line A and/or the microstrip line B may be doubled, and the characteristic impedance may be reduced accordingly. Further, the length of the microstrip line A and/or the microstrip line B may be scaled so as to operate as an inductor with a low Q factor to avoid oscillation in the input matching network. In one example design, where the magnetically insensitive input balun 10 is a 4:1 balun, it is easy to match the input impedances of parallel MOSFETs with the output impedances of the 4:1 balun.

The method performed by the RF amplifier 300 shown in FIG. 5 is similar to the method performed by the RF amplifier in FIG. 2, and thus is omitted.

The structure of the apparatus for amplifying a RF signal should not be limited to the structures of the RF amplifiers mentioned above. It will be apparent to those skilled in the art that the various aspects of the invention claimed may be practiced in other examples that depart from these specific details.

In an example design, there may be provided more than two groups of the MOSFETs for amplifying the balanced signals. One or more splitters may be needed for distributing the balanced signals to each group of the MOSFETs, and the magnetically insensitive input matching network (e.g. one or more microstrip lines) may be adjusted accordingly. In an example design, both the microstrip lines (e.g. microstrip lines A, B, C and D) and the strip lines (e.g. strip lines E and F) are formed as copper foils and fabricated by the PCB technology.

Since all magnetically sensitive components, such as magnetically sensitive material used in the input/output baluns, inductors or ferrite transformers included in the input/output matching networks and RF chock coils, are removed from the RF amplifier, the MRI system comprising the RF amplifier may be compatible with a strong magnetic field. The loss may be reduced by taking advantage of the linear input/output matching networks. A full planar structure, including the planar structure of the input/output baluns, the microstrip lines (e.g. microstrip lines A, B, C and D) and the strip lines (e.g. strip lines E and F) formed by the PCB technology, allow the schematic layout of the RF amplifier to be simplified. So, the RF amplifier may be more compact and can be reproduced easily. The cost of the RF amplifier is low accordingly.

It should be noted that the above-mentioned embodiments illustrate rather than limit the invention and that those skilled in the art will be able to design alternative embodiments without departing from the scope of the appended claims. In the claims, any reference signs placed between parentheses shall not be construed as limiting the claim. The word "comprising" does not exclude the presence of elements or steps not listed in a claim or in the description. The word "a" or "an" preceding an element does not exclude the presence of a plurality of such elements. In the system claims enumerating several units, several of these units can be embodied by one and the same item of software and/or hardware. The usage of the words first, second and third, et cetera, does not indicate any ordering. These words are to be interpreted as names.

The invention claimed is:

1. An apparatus for amplifying a radio-frequency signal, comprising:
    a magnetically insensitive input balun for converting the RF signal in unbalanced format into balanced signals;
    at least two groups of MOSFETs, each group including at least one MOSFET for respectively amplifying the balanced signals in a push-pull way;
    a magnetically insensitive output balun for converting the amplified balanced signals into an unbalanced format;
    a magnetically insensitive input matching network for matching input impedances of the at least two groups of MOSFETs with output impedances of the magnetically insensitive input balun;
    a magnetically insensitive output matching network for matching output impedances of the at least two groups of MOSFETs with input impedances of the magnetically insensitive output balun; and
    a magnetically insensitive protection circuit for protecting a direct current power supply which provides DC for driving the at least two groups of MOSFETs from the amplified balanced signals;
    wherein at least one of the magnetically insensitive input matching network and the magnetically insensitive output match network comprise at least two groups of microstrip lines.

2. The apparatus of claim 1, wherein each group of MOSFETs includes two or more MOSFETs and the apparatus further comprises:
    at least two splitters for dividing the balanced signals and supplying the divided balanced signals to the magnetically insensitive input matching network for enabling each of the divided balanced signals to be matched with the input impedance of the corresponding MOSFET in the two groups of MOSFETs.

3. The apparatus of claim 1, wherein each group of MOSFETs includes two or more MOSFETs; and the gate electrodes, the drain electrodes of the two or more MOSFETs are parallel-connected respectively.

4. The apparatus of claim 1, wherein any one of the magnetically insensitive input balun and the magnetically insensitive output balun is a planar magnetically insensitive balun.

5. The apparatus of claim 1, wherein each microstrip line of the magnetically insensitive input matching network corresponds to one of the at least two groups of MOSFETs for matching the input impedances of the at least two groups of MOSFETs with the output impedances of the magnetically insensitive input balun respectively.

6. The apparatus of claim 1, wherein each microstrip line of the magnetically insensitive output matching network corresponds to one of the at least two groups of MOSFETs for matching the output impedances of the at least two groups of MOSFETs with the input impedances of the magnetically insensitive output balun respectively.

7. The apparatus of claim 6, wherein the magnetically insensitive protection circuit comprises at least two strip lines and at least two groups of capacitors corresponding to the at least two groups of MOSFETs respectively; the strip line the capacitors and the microstrip lines of corresponding to the same group of MOSFETs are scaled to form a RF ground to enable the amplified balanced signals to be fed to the RF ground.

8. The apparatus of claim 7, wherein the magnetically insensitive protection circuit further comprises at least two cables connecting the at least two groups of capacitors and the DC power supply respectively, each cable operating with the strip line, the capacitors and the microstrip lines for blocking the amplified balanced signals from the DC power supply.

9. The apparatus of claim 5, wherein the microstrip lines and/or the strip lines are Printed Circuit Boards.

10. A magnetic resonance imaging system, comprising the apparatus for amplifying the radio-frequency signal according to claim 1.

11. A method of amplifying a radio-frequency signal, comprising:
    converting the RF signal in unbalanced format into balanced signals by a magnetically insensitive input balun;
    matching input impedances of at least two groups of MOSFETs with output impedances of the magnetically insensitive input balun by a magnetically insensitive input matching network;
    amplifying the balanced signals in a push-pull way by the at least two groups of MOSFETs, each group including at least one MOSFET;
    matching output impedances of the at least two groups of MOSFETs with input impedances of a magnetically insensitive output balun by a magnetically insensitive output matching network;
    converting the amplified balanced signals into an unbalanced format by the magnetically insensitive output balun; and
    wherein the amplified balanced signals are blocked by a magnetically insensitive protection circuit from a direct current power supply which provides DC for driving the at least two groups of MOSFETs wherein at least one of the magnetically insensitive input matching network and the magnetically insensitive output match network comprise at least two groups of microstrip lines.

12. The method of claim 11, wherein each group of MOSFETs includes two or more MOSFETs and the method further comprises:
dividing the balanced signals by at least two splitters; and
supplying the divided balanced signals to the magnetically insensitive input matching network) for enabling each of the divided balanced signals to be matched with the input impedance of the corresponding MOSFET in the two groups of MOSFETs.

13. The method of claim 11, wherein each group of MOSFETs includes two or more MOSFETs; and the gate electrodes, the drain electrodes of the two or more MOSFETs are parallel-connected respectively.

14. The method of claim 11, wherein any one of the C magnetically insensitive input balun, the magnetically insensitive output balun, the magnetically insensitive input matching network, the magnetically insensitive output matching network and the magnetically insensitive protection circuit are Printed Circuit Boards.

15. A magnetic resonance imaging system, comprising:
an apparatus for amplifying a radio-frequency signal, comprising:
a magnetically insensitive input balun configured to convert the RF signal in unbalanced format into balanced signals;
at least two groups of MOSFETs, each group including at least one MOSFET configured to respectively amplify the balanced signals;
a magnetically insensitive output balun configured to convert the amplified balanced signals into an unbalanced format;
a magnetically insensitive input matching network configured to match input impedances of the at least two groups of MOSFETs with output impedances of the magnetically insensitive input balun;
at least two splitters configured to divide the balanced signals and supply the divided balanced signals to the magnetically insensitive input matching network;
a magnetically insensitive output matching network configured to match output impedances of the at least two groups of MOSFETs with input impedances of the magnetically insensitive output balun, and
a magnetically insensitive protection circuit configured to protect a direct current power supply which provides DC for driving the at least two groups of MOSFETs from the amplified balanced signal wherein at least one of the magnetically insensitive input matching network and the magnetically insensitive output match network comprise at least two groups of microstrip lines.

16. The system of claim 15, wherein each microstrip line of the magnetically insensitive input matching network corresponds to one of the at least two groups of MOSFETs for matching the input impedances of the at least two groups of MOSFETs with the output impedances of the magnetically insensitive input balun respectively.

17. The system of claim 15, wherein each microstrip line of the magnetically insensitive output matching network corresponds to one of the at least two groups of MOSFETs for matching the output impedances of the at least two groups of MOSFETs with the input impedances of the magnetically insensitive output balun respectively.

18. The system of claim 17, wherein the magnetically insensitive protection circuit comprises at least two strip lines and at least two groups of capacitors corresponding to the at least two groups of MOSFETs respectively; the strip line, the capacitors and the microstrip lines of corresponding to the same group of MOSFETs forming a RF ground to enable the amplified balanced signals to be fed to the RF ground.

19. The system of claim 18, wherein the magnetically insensitive protection circuit further comprises at least two cables connecting the at least two groups of capacitors and the DC power supply respectively, each cable operating with the strip line, the capacitors and the microstrip lines for blocking the amplified balanced signals from the DC power supply.

* * * * *